United States Patent
Dolman et al.

(10) Patent No.: US 6,480,061 B2
(45) Date of Patent: *Nov. 12, 2002

(54) AMPLIFIER HAVING DIGITAL MICRO PROCESSOR CONTROL APPARATUS

(75) Inventors: Graham Dolman, Saffron Walden; Peter King, Thames Ditton; Andrew John Booth, Bishop Stortford, all of (GB)

(73) Assignee: Nortel Networks Limited, St. Laurent (CA)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/480,508

(22) Filed: Jan. 10, 2000

(65) Prior Publication Data

US 2002/0109550 A1 Aug. 15, 2002

(30) Foreign Application Priority Data

Jan. 13, 1999 (GB) ................................................ 9900641

(51) Int. Cl.[7] ............................. G01R 19/00; H03F 3/04
(52) U.S. Cl. ............................. 330/2; 330/136; 330/289
(58) Field of Search ..................... 330/2, 129, 133, 330/134, 136, 285, 289

(56) References Cited

U.S. PATENT DOCUMENTS

| | | | | |
|---|---|---|---|---|
| 4,924,191 A | | 5/1990 | Erb ............................. 330/130 |
| 5,194,822 A | * | 3/1993 | Bureau et al. ................. 330/2 |
| 5,268,601 A | * | 12/1993 | Cossins ...................... 330/289 |
| 5,371,473 A | * | 12/1994 | Trinh et al. .................. 330/129 |
| 5,376,895 A | * | 12/1994 | Aihara ........................ 330/129 |
| 5,410,272 A | * | 4/1995 | Haberland et al. .......... 330/129 |
| 5,504,457 A | * | 4/1996 | Jensen ........................ 330/129 |
| 5,826,177 A | * | 10/1998 | Uno ............................ 330/129 |
| 5,903,854 A | * | 5/1999 | Abe et al. .................... 330/295 |
| 5,923,215 A | * | 7/1999 | Hans ........................... 330/132 |
| 6,038,432 A | * | 3/2000 | Onoda ........................ 330/129 |
| 6,259,901 B1 | * | 7/2001 | Shinomija et al. .......... 330/133 |

* cited by examiner

Primary Examiner—Robert Pascal
Assistant Examiner—Khanh Van Nguyen
(74) Attorney, Agent, or Firm—Lee, Mann, Smith, McWilliams, Sweeney & Ohlson

(57) ABSTRACT

This invention relates to an amplifier having digital microprocessor control apparatus and, in particular, to a high frequency power amplifier that includes a micro-processor control system to accurately regulate the operating point of the various amplifying elements in the high frequency power amplifier. The basic amplifier circuitry consists of a microcontroller, a variable voltage attenuator (VVA), a digital to analogue converter and an EEPROM. The EEPROM provides a lookup table which is read by the micro-controller, which then writes to the digital to analogue converter to set the control voltage to the variable voltage attenuator.

16 Claims, 14 Drawing Sheets

Power Output

Power dissipated in die

Vbe applied using DAC

Icq observed if no rf

Table 1

| Temperature sensor | Position | °C per ADC step | Offset |
|---|---|---|---|
| 1 | Control Board | 1 | 155 |
| 2 | 2044 | 2.5 | 200 |
| 3 | 2046 | 2.5 | 200 |

Table 2

| ADC value | Approx. Temperature (°C) | DAC0 Value |
|---|---|---|
| 150 | 25 | X (from lookup table) |
| 149 | 26 | X+1 |
| 148 | 27 | X+2 |
| 147 | 28 | Y-2 |
| 146 | 29 | Y-1 |
| 145 | 30 | Y (from lookup table) |

Table 3

| Power back off from 30W | Approx. Temperature (°C) of heat sink | | | | |
|---|---|---|---|---|---|
| | Vbe1 | Vbe2 | Vbe3 | Vbe4 | VbeN |
| 150 | | | | | |
| 149 | | | | | |
| 148 | | | | | |
| 147 | | | | | |

AMPLIFIER HAVING DIGITAL MICRO PROCESSOR CONTROL APPARATUS

FIELD OF THE INVENTION

This invention relates to an amplifier having digital micro-processor control apparatus and, in particular, to a high frequency power amplifier that includes a micro-processor control system to accurately regulate the operating point of the various amplifying elements in the high frequency power amplifier.

BACKGROUND TO THE INVENTION

The gain of an amplifier, especially a power amplifier will change at different frequencies, temperatures and operating levels, and between different units, unless the design compensates for these effects. It is a problem in the field of amplifiers to accurately and dynamically control the operation of the amplifying elements that comprise the amplifier.

In the case of amplifiers employed in communications systems, fast response times are required together with high output powers. Further, the input power and frequency can be different in successive bursts, so a new power level/attenuation must be set, for example in GSM applications, every 577 μs. This means that the gain control must be fast, which limits the amount of processing that can be done in real time.

A problem typically encountered in amplifiers is that the amplifying elements, exhibit a fairly significant variation in their characteristics due to manufacturing tolerances. In addition, variations in operating temperature cause a shift in the operating point of these elements as does ageing of the amplifying elements. It is a typical procedure to fine tune the amplifier operation during the amplifier manufacturing process to compensate for the diversity of manufactured amplifying elements. Dynamic changes in operating environment can be compensated for by analogue feedback circuitry that is typically found in an amplifier. This analogue feedback circuitry can provide some rudimentary control over the quiescent point of the amplifying element, although these feedback schemes typically can not compensate for variation in the operating characteristics of the devices.

In the embodiment shown in FIG. 1, the power amplifier also employs a microprocessor to change the Quiescent Collector Current (Icq) to three cascaded class AB bipolar power transistors possibly every GSM burst (577 μs) in the case of GSM applications, depending on the power amplifier output power (GSM base stations use up to 42 dB power control on each burst depending mainly on the mobile position.). The Icq is changed to make correction of the transistors' self-heating effect possible. The power transistor also suffers from an internal self-heating effect; at high powers, the junction gets hotter, and the voltage applied to the base (Vbe) requirement is less to maintain the same Icq; this is normal functioning of the class AB transistor and the collector current (Ic) due to the dc bias goes up with increasing power (This can only be seen by measuring Ic immediately after the rf is removed.). However, a transistor has a thermal time constant and there is a transition period between different dissipated powers where the Icq is incorrect for maintaining near constant gain; this has to be compensated for with the bias.

A short time constant heating effect which is observed as rounding of the GSM burst edges (known as interburst ripple), and a long time constant heating effect which is observed as change in burst gain dependant on the power history (known as history effect). The bias shaping circuit corrects for the interburst ripple with a polarized short decay differentiator fed through a very short time constant integrator. The history effect is corrected by a long time constant integrator.

One common solution to the first problem is to use a number of trimmers which are adjusted during production test to compensate for some of these effects individually. Such trimmers may be used to supplement the performance of a variable voltage attenuator which would be under the control of a micro-controller. The use of trimmers increases the set-up time, which adds to the cost of the product. If a micro-controller and variable voltage attenuator are also used then the component costs together with the costs of setting trimmers and other associated equipment would be high.

It is possible, in theory to correct for static gain by adjusting the icq to compensate for the gain expansion curves; however, this does not correct for the dynamic signal and the history effect and interburst ripple effect was observed which made the gain out of specification. Two integrators with the Icq never going beyond Icqmin and Icqmax can also be employed, but this does not fully achieve dynamic gain specification. Additionally, a polarized differentiator was required to fully correct gain for interburst ripple.

U.S. Pat. No. 4,924,191 provides an amplifier arrangement having digital bias control apparatus that uses a processor to provide precise, dynamic control over the operating point of a plurality of amplifying elements in an amplifier. This processor controls each amplifying element to optimise the operating point of each individual amplifying element as a function of the amplifying element characteristics, the operating environment and the applied input signal. If the measured values of bias signal and output signal do not match predetermined desired values as stored in the processor memory, the processor updates the predefined bias value that is stored in memory to therefore shift the nominal operating point of this amplifying element to compensate for dynamic changes in the operating environment or the operating characteristics inherent in this particular device. This disclosure sets bias employing dynamic feedback but does not, however, provide a dynamic pulse shaping circuit.

OBJECT TO THE INVENTION

The present invention seeks to provide an improved apparatus and method for controlling a power amplifier. The present invention also seeks to provide an efficient and inexpensive method of dynamically maintaining a constant gain in a power amplifier whilst the input power, input frequency and temperature are varying. The present invention further seeks to provide an amplifier circuit which compensates for variations in gain due to self-heating effect in a dynamic fashion. The present invention further seeks to provide an amplifier circuit which compensates for variations in gain with changing output power.

SUMMARY OF THE INVENTION

In accordance with a first aspect of the invention, there is provided an amplifier circuit comprising an amplifier chain, a micro-controller, a variable voltage attenuator (VVA), a digital to analogue converter and an EEPROM, wherein the EEPROM provides a lookup table which is read by the micro-controller, which is operable to the digital to analogue converter to set the control voltage to the variable voltage attenuator. The control voltage is updated continually—every 577 μs, for example, in a GSM application. The lookup table can be derived by measuring a few points at room temperature for each power amplifier and then using previously measured typical data to calculate a full lookup table to compensate each power amplifier. A routine is provided whereby to compensate the amplifier gain via the variable voltage controller for the following variables: Unit to unit gain variation; Unit to unit frequency response; Unit to unit gain variation as a function of back off; and Unit to unit gain variation as a function of temperature. The routine takes data measured from individual amplifiers during production set up along with known 'typical' responses and derives a set of EEPROM coefficients which are provided to amplifier controllers. The micro controller uses the EEPROM as a simple look up table to derive variable voltage controller settings.

The routine comprises of 3 parts: that of data gathering during unit test; that of calculating operating coefficients; and that of running the amplifier using the coefficients. The actual calculations involved in deriving the coefficients are performed in circuitry, for example in a computer outside the amplifier, and can be made as complicated as required, since there is no real time constraint on this operation.

In accordance with a still further aspect of the invention, there is provided a power amplifier which also employs a microprocessor to change the Quiescent Collector Current (Icq) to some class AB bipolar power transistors in the amplifier. The Icq is changed to make correction of the transistors' self-heating effect possible. This provides a good efficiency which is obtainable at high powers and nearly constant gain achievable from the transistor at different power levels.

In accordance with a still further aspect of the invention, there is provided a bias shaping circuit, which uses a polarized differentiator with integrator combined with another integrator can then be applied to the transistor bias. Here, the micro-controller is employed to set Icq, as a linear function of power dissipated. A waveform is thus synthesised, which waveform is shaped with differentiators and integrators.

In sliding the bias, the output from digital to analogue converter is varied during each burst. (This voltage controls Quiescent Collector current, Icq). This allows near constant gain with output power and enables a low Icq at high powers which improves efficiency.

The invention thereby provides an efficient and inexpensive method of dynamically maintaining a constant gain in an amplifier whilst the input power, input frequency and temperature are varying. A relatively few points are measured on each amplifier to provide this compensation from amplifier to amplifier without the need to adjust trimmers on each unit, thereby reducing production test time. This present invention offers a simple, inexpensive and easy to set up automatic test facility correction method for the production of signal amplification circuitry. The present invention also avails itself to the simplifying of automation during the production of amplifiers.

BRIEF DESCRIPTION OF THE DRAWING

In order that the present invention can be more fully understood and to show how the same may be carried into effect, reference shall now be made, by way of example only, to the Figures as shown in the accompanying drawing sheets wherein.

DETAILED DESCRIPTION

There will now be described, by way of example, the best mode contemplated by the inventors for carrying out the invention. In the following description, numerous specific details are set out in order to provide a complete understanding of the present invention. It will be apparent, however, to those skilled in the art, that the present invention may be put into practice with variations of the specific.

In many applications for a power amplifier, the amplifier must maintain a near constant gain over a wide variety of input conditions. A simple, uncompensated amplifier is not capable of meeting the performance requirements and so some form of compensation mechanism is required. Most TDMA power amplifiers (GSM, DCS1800, PCS1900, IS136) and CDMA power amplifiers where rapid power control is used with class AB transistors require some form of dynamic correction.

A class A amplifier is one in which the operating point and the input signal are such that the current flows at all times in the output circuit of the amplifier, whether the collector, plate or drain electrode of the amplifying element. A class A amplifier operates essentially over a linear portion of the amplifying element characteristic. A class B amplifier is one in which the operating point of the amplifying element is at an extreme end of its characteristic, so the quiescent power is very small and either the quiescent current or the quiescent voltage is approximately zero. If the input signal is sinusoidal, amplification takes place for only one-half a cycle of the sinusoidal input signal. A class AB amplifier is one operating between the two extremes defined for class A and class B amplifiers. Hence the output signal is zero for part but less than one half of an input sinusoidal signal cycle.

Figure 1:
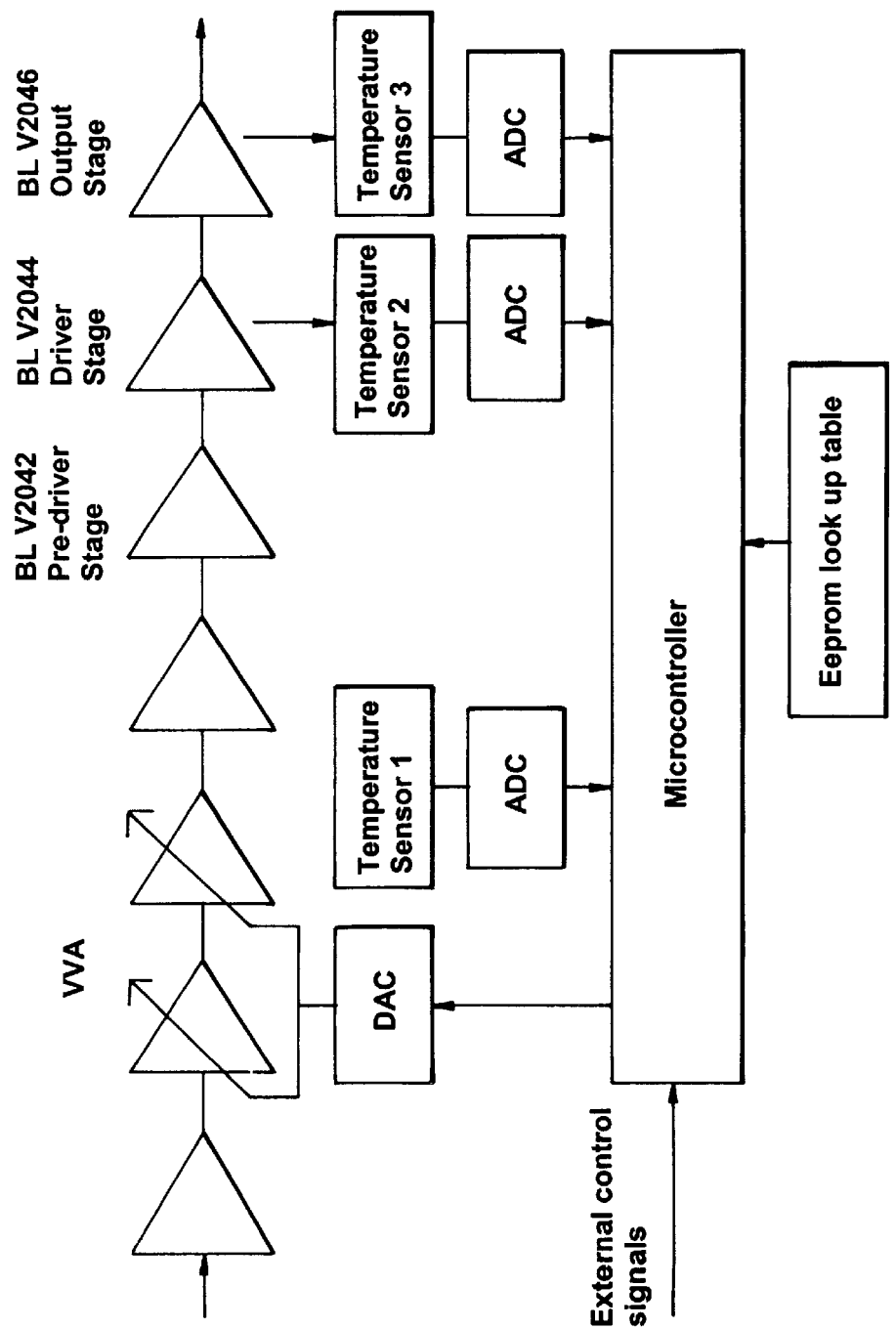
FIG. 1 shows an amplifier line up showing compensation elements.

Referring now to FIG. 1, there is shown an amplifier circuit. The basic hardware consists of a micro-controller, a variable voltage attenuator (VVA), a digital to analogue converter and an EEPROM. The EEPROM provides a lookup table which is read by the micro-controller, which then writes to the digital to analogue converter to set the control voltage to the variable voltage attenuator. The control voltage is updated continually—every 577 μs, for example, in a GSM application. The lookup table is derived by measuring a few points at room temperature for each power amplifier and then using previously measured typical data to calculate a full lookup table to compensate each power amplifier.

For production testing the variable voltage attenuator can be adjusted to provide the correct gain at a few input levels and frequencies at room temperature and the corresponding digital to analogue converter values are stored. An interpolation routine is used to calculate the other room temperature values to reduce the number of points measured, keeping the test time short.

Following this, a few measurements are determined to characterise the non-linear response of the variable voltage attenuator. A typical curve is fitted to these points to reduce the number of points measured, keeping the test time short. The typical gain response of the uncompensated power amplifier versus temperature has been measured/derived in the lab and this response is combined with the above measurements.

Since a variable voltage attenuator response is non-linear the gain versus temperature is measured in dBs, as opposed to digital to analogue converter steps because the number of digital to analogue converter steps varies from power amplifier to power amplifier. The variable voltage attenuator response is used to convert the room temperature digital to analogue converter values into dBs, which are combined with the gain vs. temperature points. Then the inverse variable voltage attenuator function is used to convert these values back into digital to analogue converter values which are stored in the EEPROM.

The micro-controller also implements a simple interpolation routine to improve the resolution of the compensation with respect to temperature, without increasing the size of the lookup table. The routine was kept very simple by carefully matching the step sizes of the variable voltage attenuator and the temperature sensor.

In one aspect of the invention there is provided a routine which can also act as a gain compensation algorithm, which can be used to derive the EEPROM coefficients and how these should be interpreted by the micro-controller.

The routine is intended to compensate the amplifier gain via the variable voltage controller for the following variables:

1) Unit to unit gain variation
2) Unit to unit frequency response
3) Unit to unit gain variation as a function of back off
4) Unit to unit gain variation as a function of temperature.

The routine takes data measured from individual amplifiers during production set up along with known 'typical' responses and derives a set of EEPROM coefficients which are provided to amplifier controllers. The micro controller uses the EEPROM as a simple look up table to derive variable voltage controller settings.

The routine comprises of 3 parts: that of data gathering during unit test; that of calculating operating coefficients; and that of running the amplifier using the coefficients. The actual calculations involved in deriving the coefficients are performed in circuitry, for example in a computer outside the amplifier, and can be made as complicated as required, since there is no real time constraint on this operation.

An object of the routine is to separate temperature out from back off (output power) and frequency response as an orthogonal variable. This is because output power and frequency response will be characterised for each unit in production, whilst temperature response will not. Therefore, there is a requirement to be able to add temperature compensation based on a 'typical' response.

Figure 3:
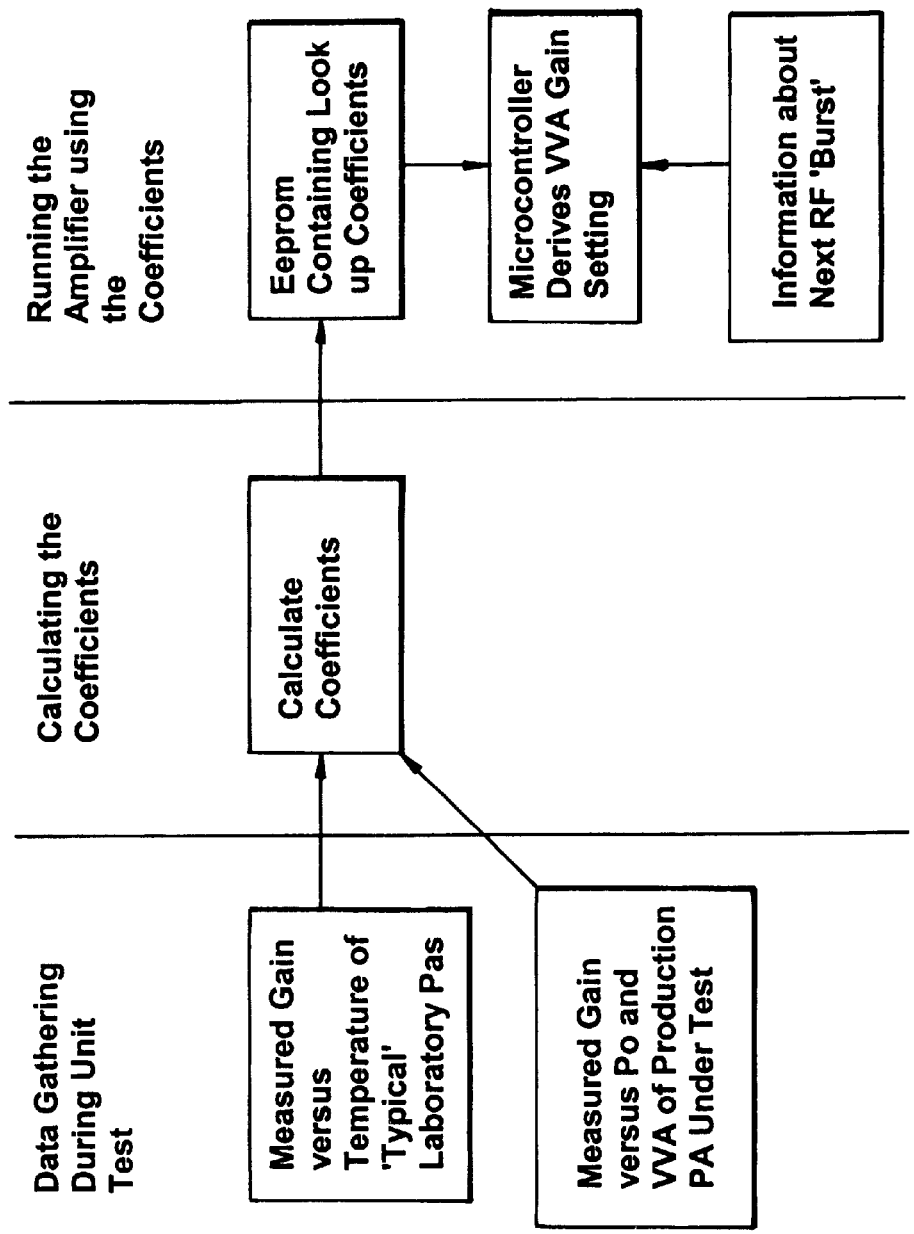
FIG. 3 shows the stages in an algorithm.
Figure 4:
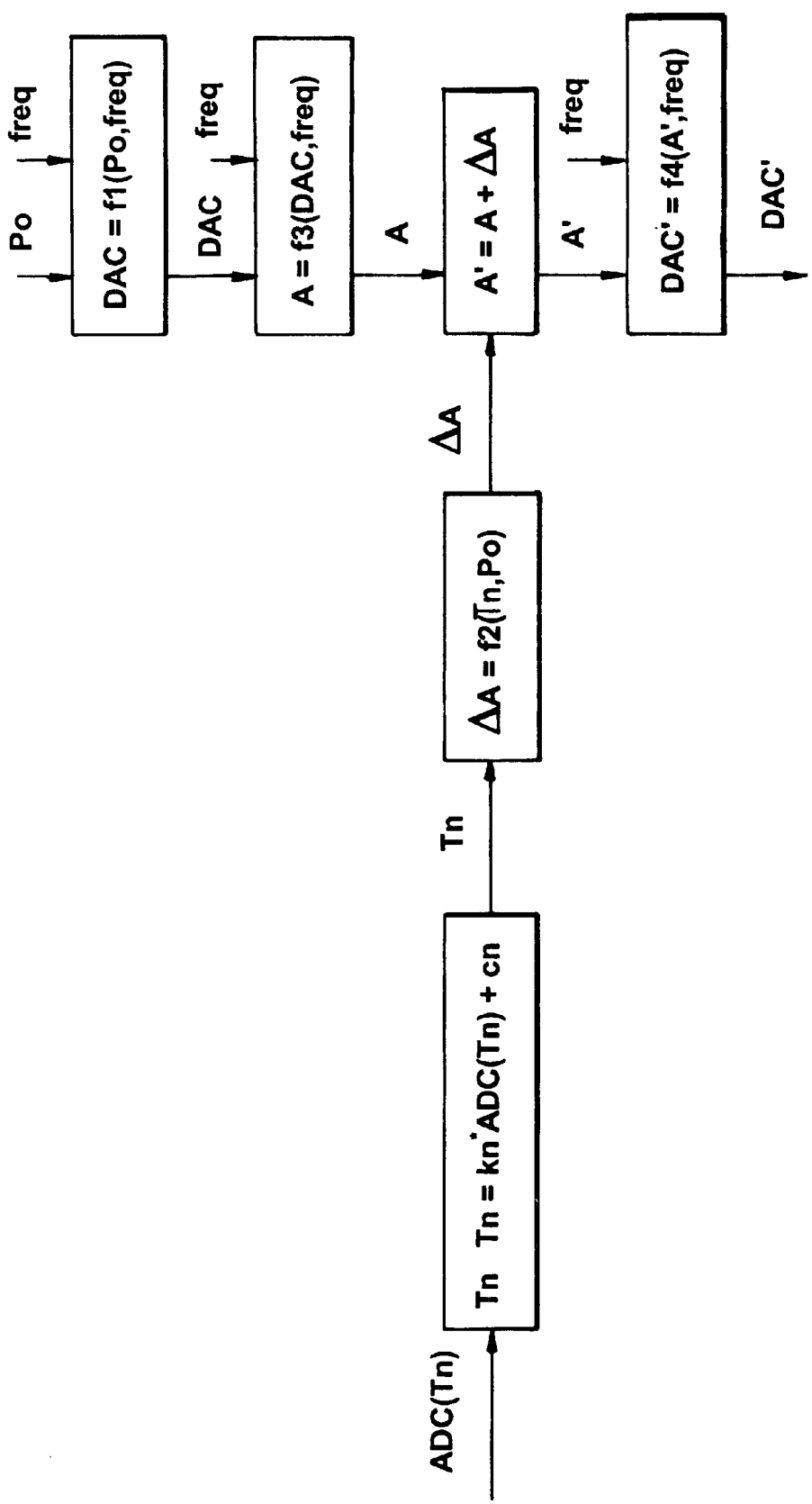
FIG. 4 shows a method of deriving coefficients for the look up table.
Figure 5:
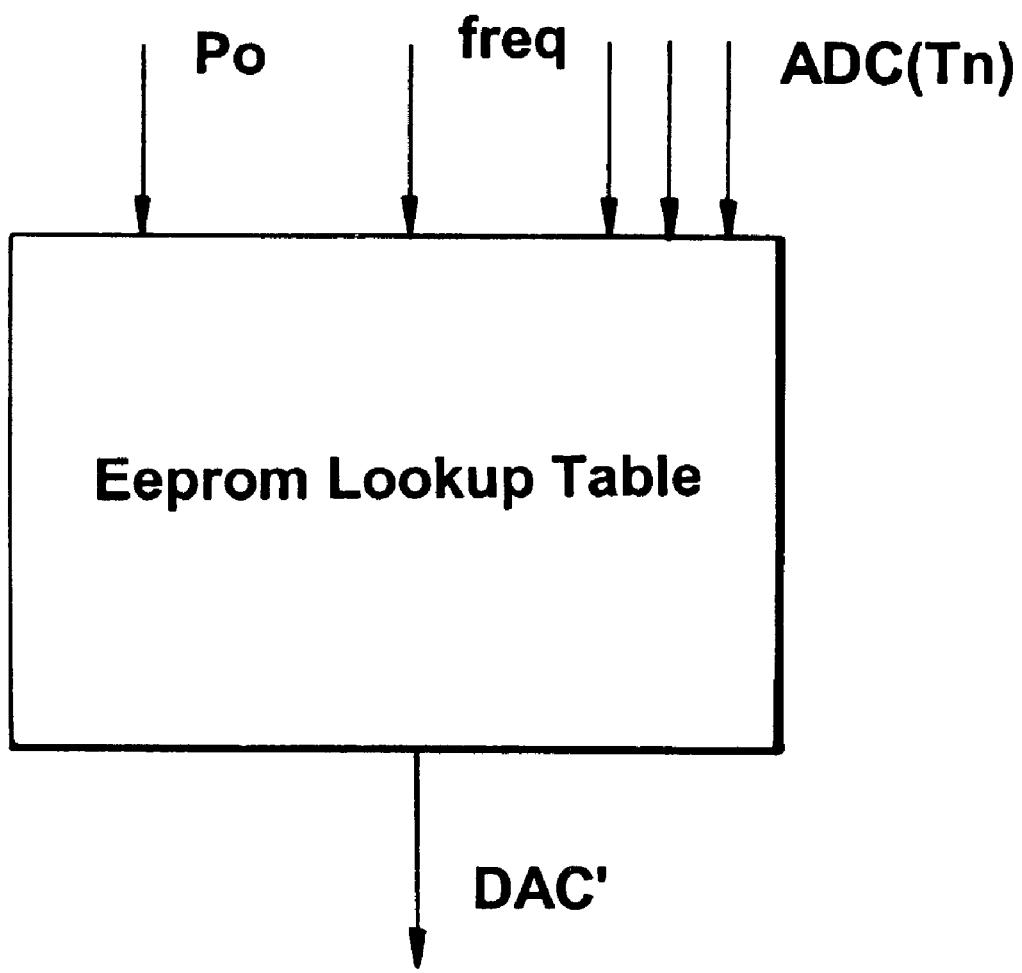
FIG. 5 shows a form of an EEPROM look up table.

The coefficients are calculated by deriving a set of mathematical functions fitted to the measured data, as defined by the following steps with reference to FIG. 3.

Step 1: DAC=f1(Po,freq)

From production measurements, the values of DAC required to maintain a constant desired gain as a function of frequency and output power are determined. For this test, the required input power is set (=required output power−required gain) then DAC is incremented until the required output (Po) is achieved.

Typically, in a production environment, it would be possible to restrict the number of measurements required by assuming that the gain is constant as a function of Po below a power level corresponding to class A operation (TBC) and by restricting the number of frequency points. Using a mathematical surface fit routine, the closed form function for DAC as a function of Po and freq is derived. It may be necessary to interpolate between freq and Po points in order to obtain a matrix suitable for surface fitting.

An assumption made here is that a nearly constant amplifier temperature is maintained during the testing. Self heating effects are discussed later on.

Step 2: A=f3(DAC,freq)

In step 2, a corresponding gain numbers (in dB) to the DAC value is obtained. This step is required as variable voltage controller responses are not perfectly linear or repeatable from unit to unit. This step therefore calibrates out variable voltage controller response variations.

From production measurements at low power, the amplifier gain is measured as a function of DAC and freq. It is important here that the amplifier remains in class A even when the variable voltage controller is at maximum gain. The optimum number of readings should be small as the required function is typically smooth and well behaved. Using a surface fit routine, the closed form function for A as a function of DAC and freq is derived.

Step 3: A'=A+ΔA

This step adds a gain compensation factor which is derived later. It is a simple addition function:

Step 4: DAC'=f4(A',freq)

Using surface fitting on the same measurement data points as used for step 2, the inverse function to f3 is derived as a closed form function. It is possible to identify errors caused in the curve fitting process and digital to analogue converter resolution at this stage by running the two functions f3, f4 back to back with ΔA set to zero.

The output from step 4 is now the required compensated variable voltage controller digital to analogue converter value.

Step 5: Tn=kn*ADC(Tn)+cn

Step 5 calibrates the temperature sensors. All of the temperature sensors rely on the linear variation of the Vbe of a transistor with temperature. Depending on the sensor, this Vbe value can be amplified and/or inverted.

The coefficients (k1, k2, k3) are pre-characterised and is conveniently assumed as constant for all units. Offset values (c1, c2, c3) are derived in the production test of each unit at room temperature. If the temperature response of the amplifier is fairly linear, as expected, then there is no need to relate T1, T2, T3 to absolute temperatures. These values may, therefore, be calculated with respect to factory ambient (T=0=steady state ambient whereby, cn becomes −kn*ADC (Tn) at ambient).

Step 6: ΔA=f2(Tn,Po)

In step 6, the temperature compensation in dB, derived by experimentation is calculated.

The micro-controller is employed to set a variable voltage attenuator (VVA) to maintain the overall gain. The micro-controller sets the variable voltage attenuator based upon a lookup table which is calculated and loaded during Production Test.

The Input Power is permitted a particular range, as follows:

| | |
|---|---|
| Static Attenuation = 0 . . . 12 dB (in 2 dB steps) | 3 bits |
| Dynamic Attenuation = 0 . . . 30 dB (in 2 dB steps) | 4 bits |

The range is accordingly equal to 0.42 dB (which is equivalent to 22 values) If the static attenuation is incorrect, e.g. equal to 14 dB, then DAC_MAX_IP levels will be used. The frequency figure is a 7 bit number, 128 values in 1.6 MHz steps. The use of 16 steps provides 4.8 MHz resolution in the 75 MHz operating band.

The temperature can be measured via the analogue to digital converter from three sources. The routine only uses the sensor on the Control Board. Table 1 shows the position and approximate resolution of each sensor. All 3 temperature sensors are read using 10-bit analogue to digital converter resolution, and are then converted into an 8-bit number range by subtracting the offset shown in the last column. For example temperature sensors 2 and 3 both have an input voltage range of approximately 1.25V to 1.6V, which corresponds to an approximate analogue to digital converter reading of 260 to 330. Subtracting 200 means the reported reading ranges from 60 to 130 which can be represented by an 8-bit number.

The variable voltage controller lookup table is conveniently stored in the parallel EEPROM, which is a 3-dimensional array of digital to analogue converter value versus input power, frequency and temperature. Typically, the EEPROM will store values for all 22 input powers, for 16 frequency values and for 17 temperature values, providing a table of 5984 bytes (22×16×17).

The values for the control levels are determined every burst. The calculation uses information from a modulator and therefore the calculation cannot start until at least the $2^{nd}$ byte has been received from the DRX. In this case three bytes are sent every burst providing data relating to the carrier attributes as well as check data.

To increase the accuracy of the compensation without increasing the size of the lookup table, 'simple interpolation' is carried out between the temperature values. The temperature values are stored at 5° C. intervals and the gain decreases by approximately 0.5 dB for every 5° C. increase in temperature. The average variable voltage controller step size is approximately 0.13 dB. Table 2 shows an example of how this works. If the analogue to digital converter value is 150 or 145 the value is taken directly from the lookup table in the EEPROM. Between these two values 1 or 2 digital to analogue converter steps are added to or subtracted from the closest value in the lookup table.

If the temperature is below 0° C. or above 80° C. then the closest value from the lookup table is used, but no further 'interpolation' is carried out. The analogue to digital converter value corresponding to room temperature is programmed into the lookup table and the code assumes that the temperature will be 10° C. higher for every step the analogue to digital converter is below this value. Room temperature is the analogue to digital converter value that is read during the production test characterisation routine. Between bursts the control levels will be set to the new levels, which may be the same as the previous one. The digital to analogue converters are written to every burst even if the control level has not changed.

Figure 6:
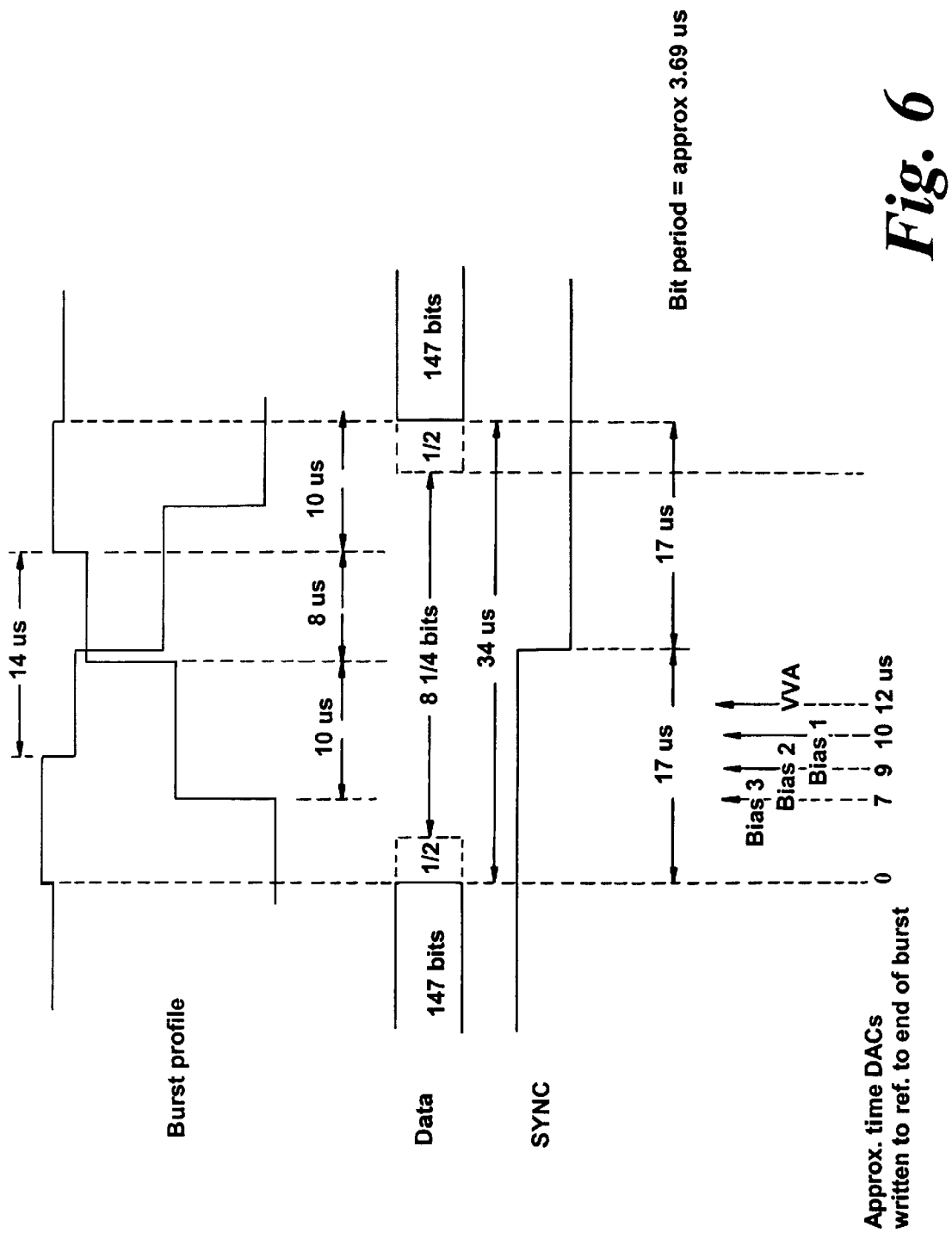
FIG. 6 shows a GSM communications protocol inter-burst timing diagram.
Figure 7:
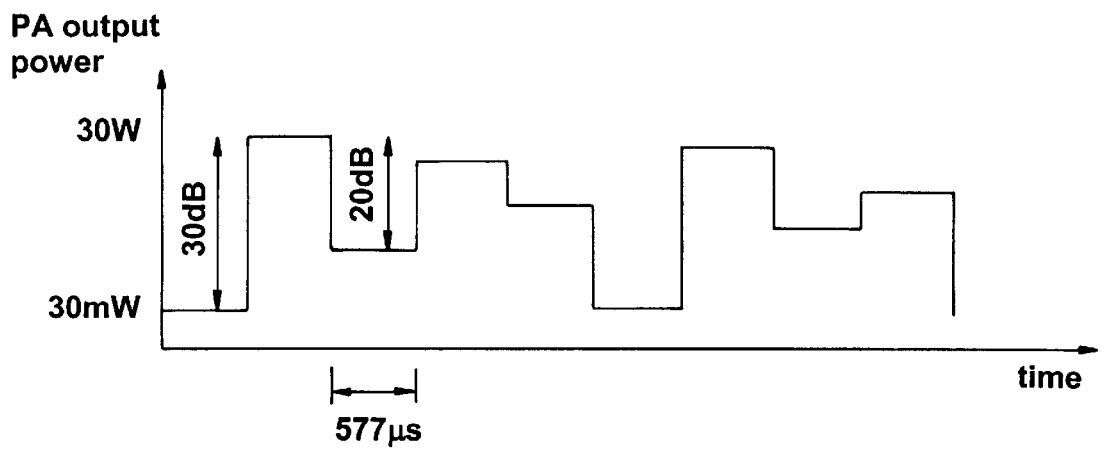
FIG. 7 shows a typical GSM signal input to a power amplifier.
Figure 8:
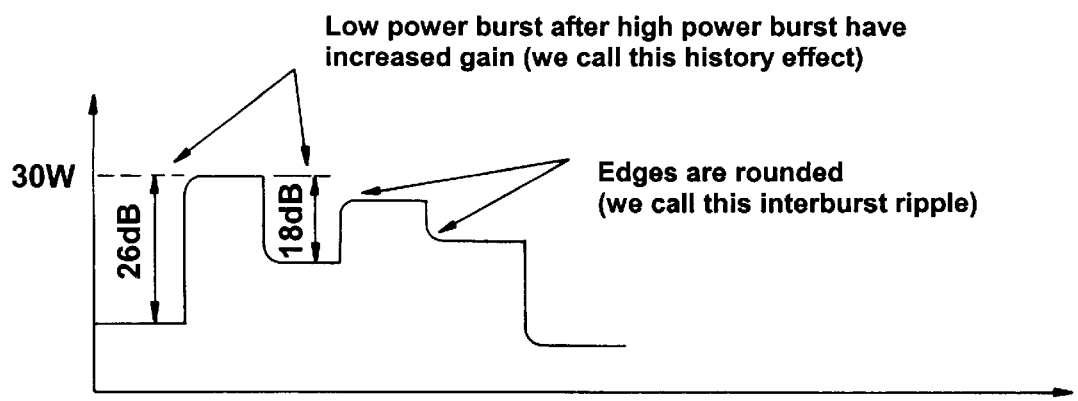
FIG. 8 shows an output from a power amplifier having the input of FIG. 6.

The timing of the data transfer to the 4 digital to analogue converters is shown in FIG. 6. The variable voltage controller is changed as soon as possible after the end of the burst plus 10 μs. It is delayed by 10 μs because the burst could still be at full power up until this time. Therefore the variable voltage controller is changed after about 12 μs and the three bias levels are set just before the variable voltage controller is changed.

Figure 2:
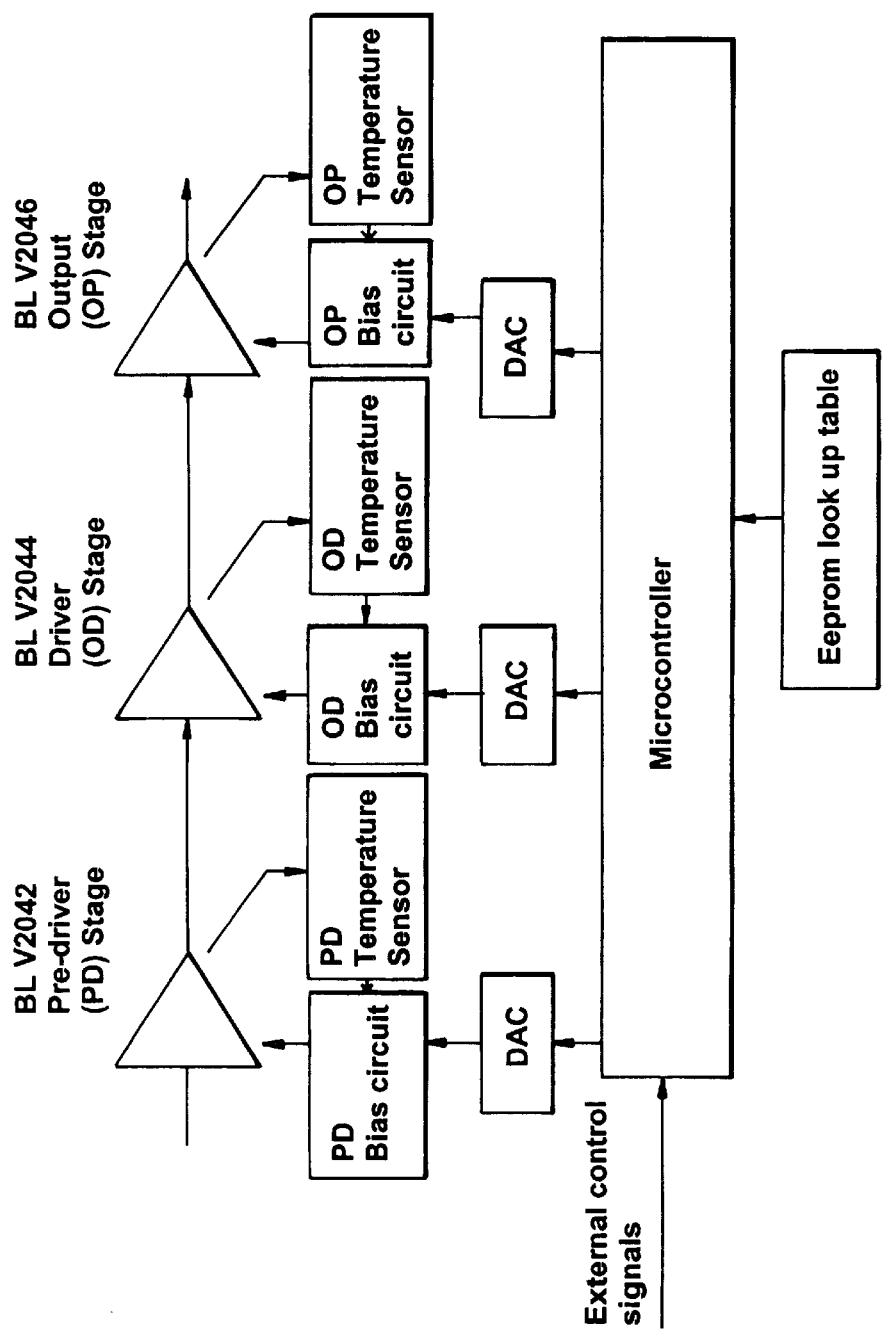
FIG. 2 details the final cascade of three amplifier stages of FIG. 1.

In the embodiment shown in FIG. 1, the power amplifier also employs a microprocessor to change the Quiescent Collector Current (Icq) to three class AB bipolar power transistors possibly every GSM burst (577 μs), depending on the power amplifier output power. (GSM basestations use up to 42 dB power control on each burst depending mainly on the mobile position.) The Icq is changed to make correction of the transistors' self-heating effect possible, good efficiency obtainable at high powers and nearly constant gain Achievable from the transistor at different power levels. The actual value of Icq follows a curve based on the power dissipated within the transistor and not just compensating for gain expansion. This ensures that the correction for transistor self-heating works during dynamic burst (see below), in addition to achieving adequate static flat gain with power backoff. FIG. 2 shows in greater detail the micro-controller's interaction with the last three cascaded amplifiers.

In order to overcome the internal self-heating effect at high powers, use is made of a thermal time constant associated with the transistor and a transition period between different dissipated powers where the Icq is incorrect for maintaining near constant gain, and which is compensated for with the bias. This is carried out by integrating and differentiating the bias voltage simultaneously and applying the composite signal to the transistor bias. A further feature of the micro-controller is that it can be employed to change the Icq with power. A bias shaping circuit, which uses a polarized differentiator with integrator combined with another integrator can then be applied to the transistor bias.

The stages of operation are as follows: The micro-controller is employed to set Icq, as a linear function of power dissipated. A waveform is thus synthesised, which waveform is shaped with differentiators and integrators.

Referring now to FIG. 6, there is shown inter-burst ripple (edge rounding) and history effect (a low power burst after a high power burst has increased output gain). Both of these effects are caused by the thermal lag in the transistor. When the power is changed abruptly (5μs), the transistor die takes considerably longer to cool down or heat up to the temperature which would be observed in a static power level case.

Figure 9:
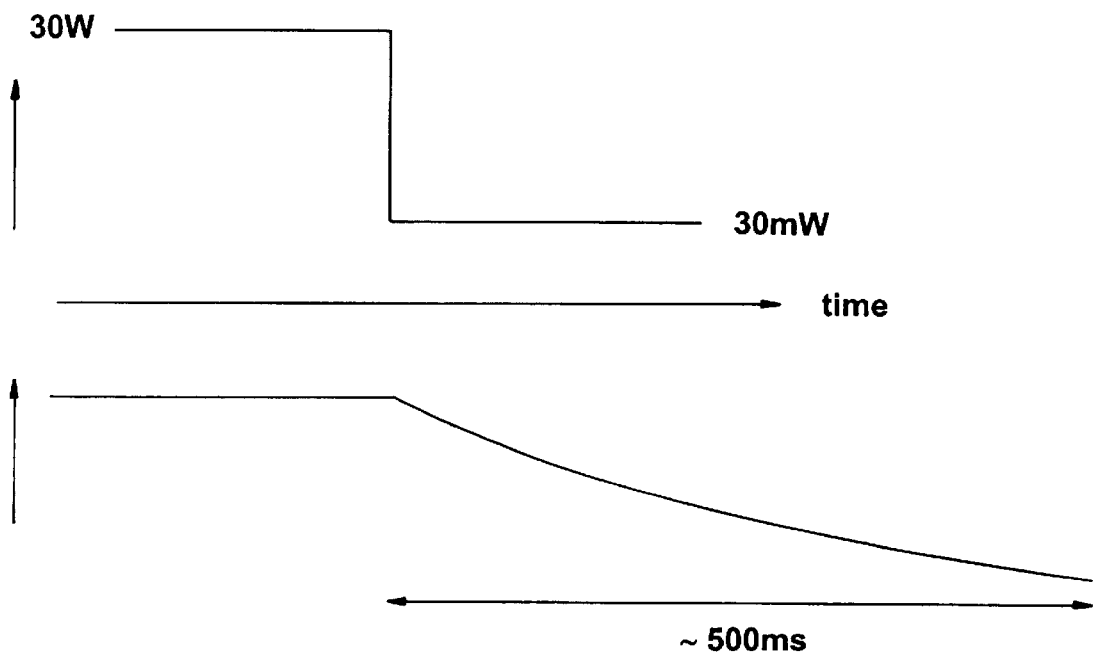
FIG. 9 details one signal transition.
Figure 10:
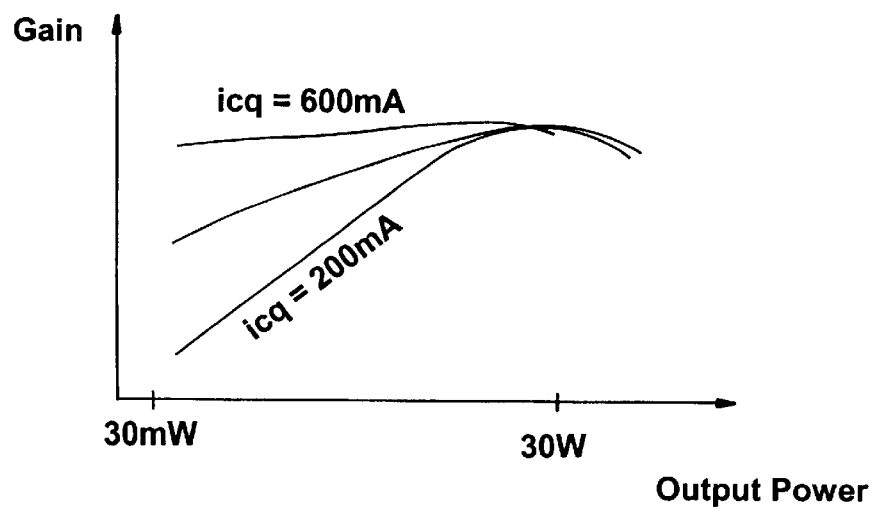
FIG. 10 shows the properties of a class AB bipolar transistor.
Figure 11:
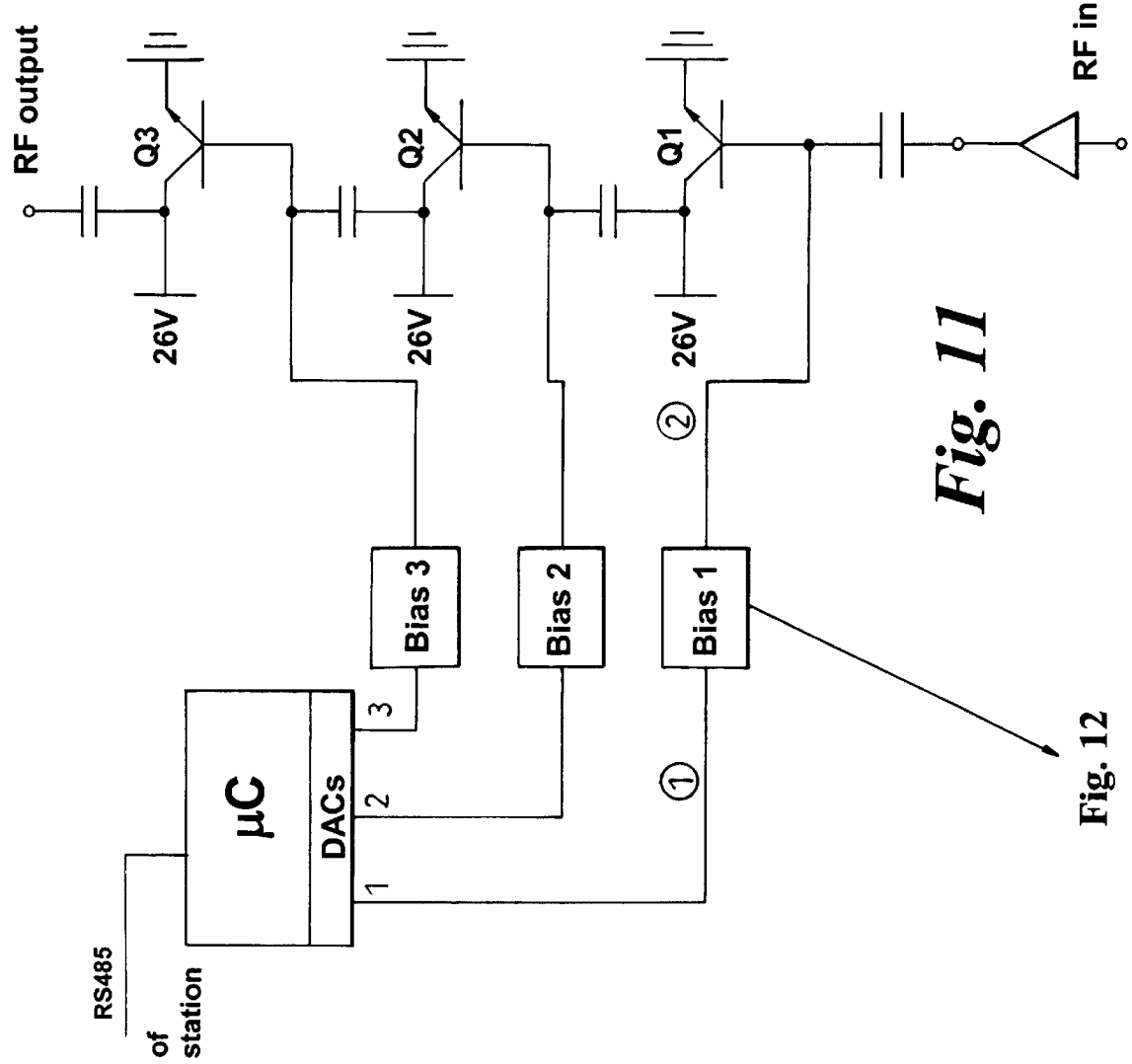
FIG. 11 shows a sliding bias circuit of FIG. 12 connected to an amplifier circuit.
Figure 12:
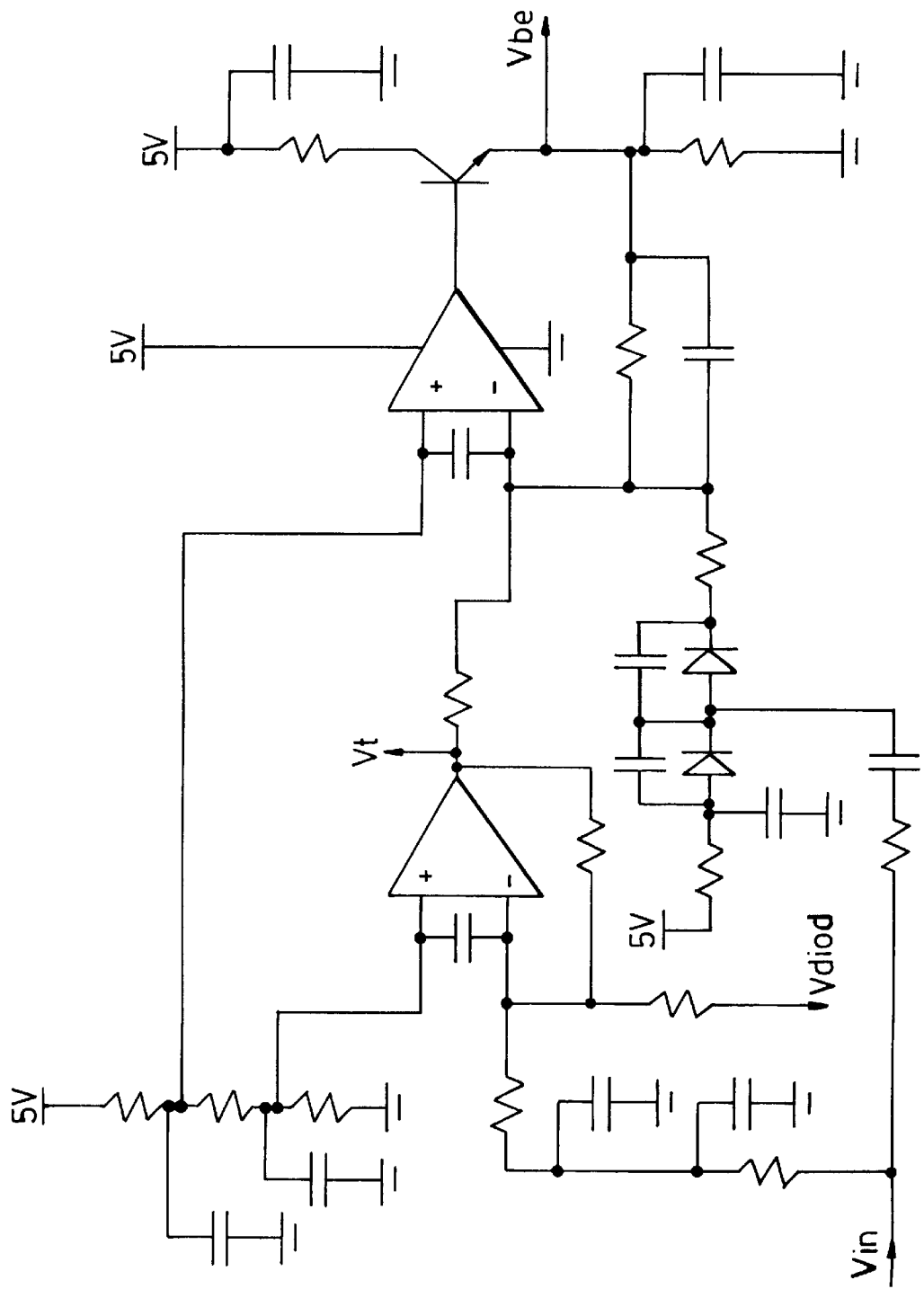
FIG. 12 details a bias circuit.
Figure 13:
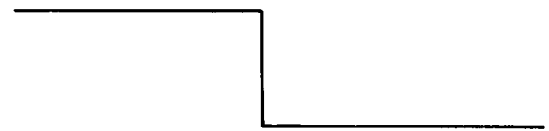
FIGS. 13–16 show output waveform using the circuit of FIG. 11.
Figure 14:
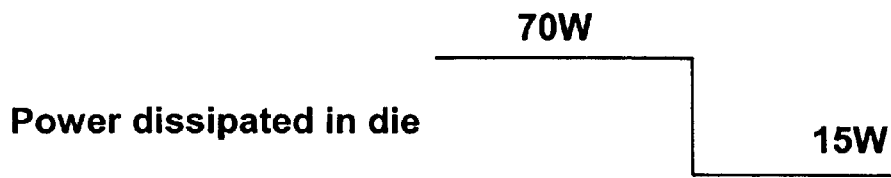
Figure 15:
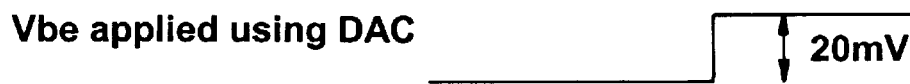
Figure 16:
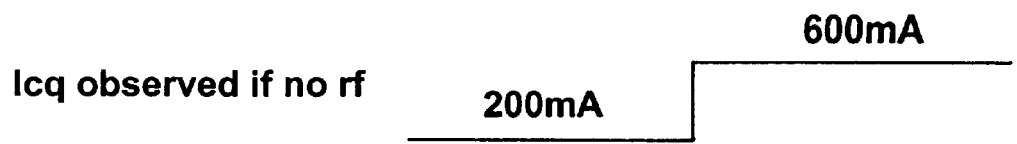
Figure 17:
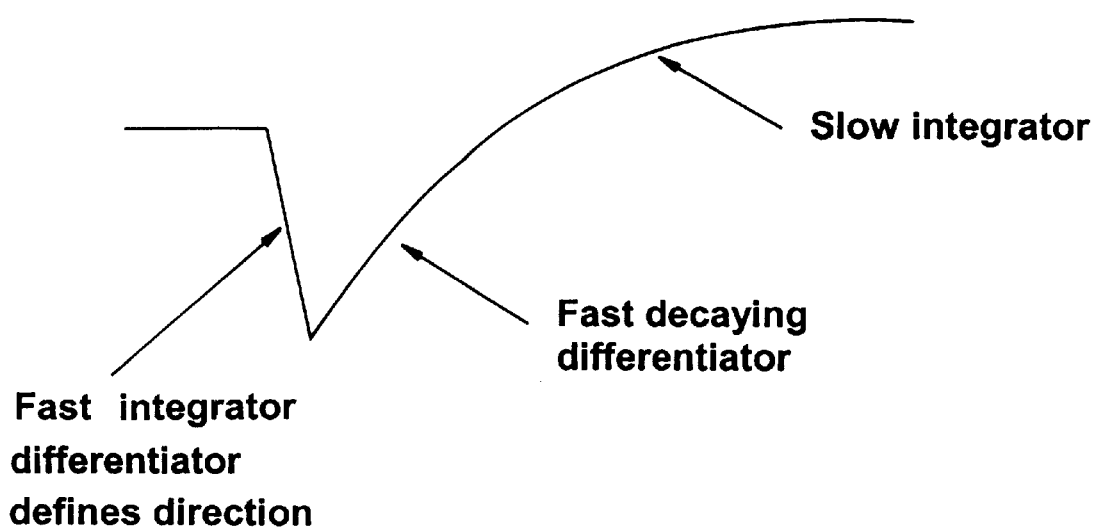
FIG. 17 details the derivation of the Vbe waveform.

In sliding the bias, the output from the digital to analogue converter is varied during each burst. (This voltage controls Quiescent Collector current, Icq). This allows near constant gain with output power (cf FIG. 9) and enables a low Icq at high powers which improves efficiency. Further, this drives the sliding bias circuit which corrects for problems in FIG. 6. Sliding bias without the pulse shaping circuit of FIG. 12 in this way solves the issue of constant gain and permits the use of a low Icq at high powers to improve efficiency. FIG. 17 shows the Vbe waveform. Adding the pulse shaping circuit has the desired effect of varying Vbe to compensate for the thermal time-constant in the transistor.

Figure 18:
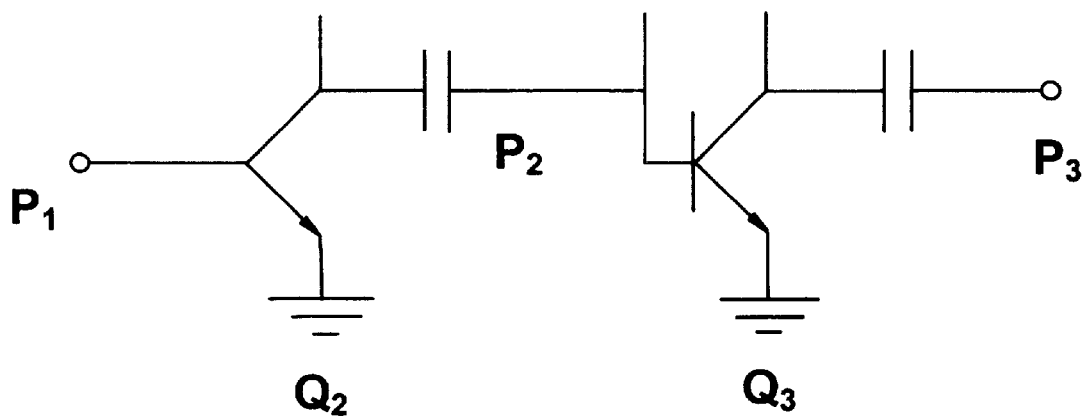
FIG. 18 shows final and penultimate gain stages.

Referring to FIG. 18, the sliding bias digital to analogue converter output can be varied over temperature as well as power to compensate for gain change with temperature in final stages. As temperature increases, P3 remains constant but P2 increases, due to gain change in Q3. Therefore power dissipated in Q2 varies with temperature and power output. A look-up table array can be used to store required bias value, as shown in table 3

Figure 19:
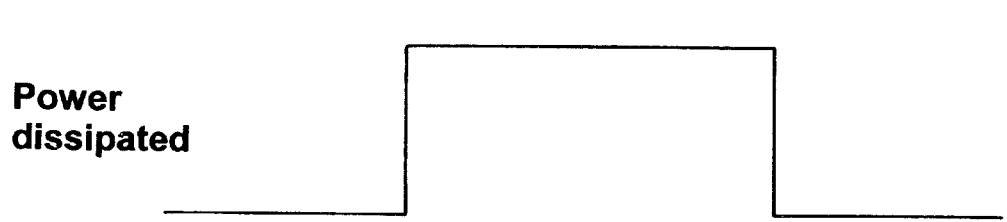
FIGS. 19 and 20 show the Vbe waveform.
Figure 20:
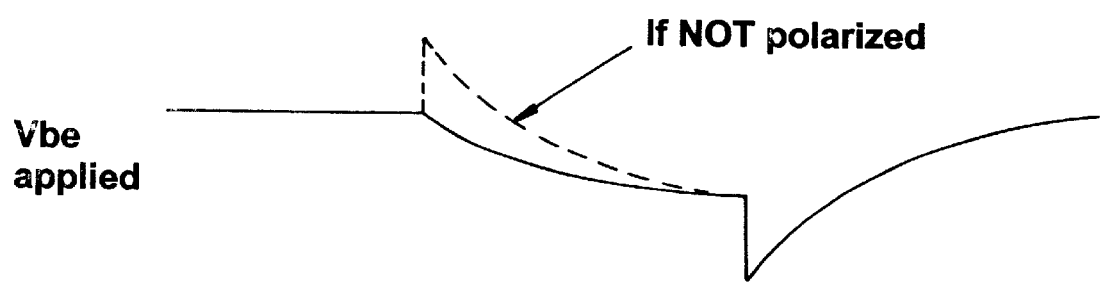

Note that the differentiator is polarised to protect the transistor: Transistors are very sensitive to Vbe; just 10 mV too much can destroy a device. Referring to FIGS. 19 and 20, the spike shown by the dotted line in FIG. 20 could destroy the transistor in some cases.

The problems solved by the present invention are, inter alia, the correction of gain due to the self-heating effect (dynamic correction), the maintenance of gain at an effectively constant level with changing output power (static correction), and the maintenance of good efficiency at high powers. Most TDMA power amplifiers (GSM, DCS1800, PCS1900, IS136) and CDMA power amplifiers where rapid power control is used with class AB transistors require some form of dynamic correction. This invention offers a clever, simple, inexpensive and easy to set up on an automatic test facility correction method.

What is claimed is:

1. An amplifier circuit having an amplifying element, a bias circuit coupled to an input of said amplifying element, and a microcontroller arranged to control the bias circuit according to predetermined criteria and determined input power to the element in order to control the amplifying element gain in order to compensate for the internal heating effects of said amplifying element, the compensation taking into account thermal lag in the amplifying element to provide more accurate control during dynamic changes in thermal effect.

2. An amplifier circuit according to claim 1 wherein the microcontroller comprises a memory device and the predetermined criteria are a number of bias control settings stored in the memory which correspond to predetermined input power values such that the microcontroller controls the bias circuit according to the setting corresponding to the determined input power.

3. An amplifier circuit according to claim 1, wherein the amplifying element gain is further dependent on: measured temperature; input frequency; specific batch dependent characteristics of the amplifying element; a combination of these.

4. An amplifier circuit according to claim 1, wherein the amplifying element is a bipolar transistor.

5. An amplifier circuit according to claim 2, wherein the memory device is an EEPROM.

6. An amplifier circuit according to claim 4, wherein the microcontroller is arranged to control the bias circuit in order to control the Quiescent Collector Current (Icq) dependent on output power of the amplifier circuit.

7. An amplifier circuit according to claim 2, wherein the microcontroller is arranged to implement an interpolation algorithm for measured values of input power between those stored.

8. An amplifier circuit according to claim 2, wherein the bias control settings are derived from previously measured operational parameters of the amplifier circuit.

9. An amplifier circuit according to claim 1 wherein the determined input power is measured in regular time slots.

10. An amplifier comprising the amplifier circuit according to claim 1 and further comprising a gain control device coupled to an input of the amplifying element in order to control the input power to the amplifying element, the gain control device being controlled by the microcontroller dependent on measured input power to the amplifying element.

11. An amplifier according to claim 10 wherein the gain control device is a variable voltage attenuator.

12. An amplifier comprising the amplifier circuit according to claim 3 and further comprising a variable voltage attenuator coupled to an input of the amplifying element in order to control the input power to the amplifying element, the attenuator being controlled by the microcontroller dependent on the determined input power to the amplifying element.

13. An amplifier comprising a number of amplifying circuits according to claim 1 each of said amplifying circuits comprising different predetermined criteria.

14. A method of operating an amplifying element in order to compensate for internal heating effects for different input signal levels, said method comprising:
    determining input signal level to said amplifying element; and
    controlling bias conditions of said element dependent on said input level and predetermined criteria while taking into account thermal lag in the amplifying element to provide more accurate control during dynamic changes in thermal effect.

15. A method according to claim 14 wherein said predetermined criteria are a number of bias control settings which correspond to predetermined input power values such that a microcontroller controls the bias conditions according to setting corresponding to determined input power, and/or an algorithm which is dependent on the determined input power.

16. A method according to claim 14 further comprising controlling the input signal level to the amplifying element dependent on the determined signal input level.

* * * * *